United States Patent
Hsu et al.

(10) Patent No.: US 7,969,745 B2
(45) Date of Patent: Jun. 28, 2011

(54) CIRCUIT BOARD STRUCTURE HAVING ELECTRONIC COMPONENTS INTEGRATED THEREIN

(75) Inventors: Shih-Ping Hsu, Hsin-Chu (TW); Kan-Jung Chia, Hsin-Chu (TW)

(73) Assignee: Unimicron Technology Corporation, Taoyuan (TW)

( * ) Notice: Subject to any disclaimer, the term of this patent is extended or adjusted under 35 U.S.C. 154(b) by 843 days.

(21) Appl. No.: 11/970,112

(22) Filed: Jan. 7, 2008

(65) Prior Publication Data

US 2008/0165515 A1    Jul. 10, 2008

(30) Foreign Application Priority Data

Jan. 8, 2007   (TW) ................................ 96100643 A

(51) Int. Cl.
*H05K 1/18* (2006.01)
*H05K 1/03* (2006.01)

(52) U.S. Cl. ........ 361/761; 361/760; 361/762; 361/763; 361/764; 174/255; 174/256

(58) Field of Classification Search .................. None
See application file for complete search history.

(56) References Cited

U.S. PATENT DOCUMENTS

| | | | |
|---|---|---|---|
| 6,430,059 B1 * | 8/2002 | Hung et al. ................... 361/793 |
| 6,442,043 B1 * | 8/2002 | Seki et al. ..................... 361/761 |
| 6,678,144 B2 * | 1/2004 | Higashi et al. ............. 361/306.3 |
| 7,286,366 B2 * | 10/2007 | Zollo et al. ..................... 361/761 |
| 7,345,888 B2 * | 3/2008 | Imamura et al. ............... 361/761 |
| 7,350,296 B2 * | 4/2008 | Ryu et al. ......................... 29/852 |
| 7,379,306 B2 * | 5/2008 | Sawatari et al. .............. 361/761 |
| 7,550,320 B2 * | 6/2009 | Wang ............................. 438/125 |
| 7,618,844 B2 * | 11/2009 | Sheats .......................... 438/108 |
| 7,894,203 B2 * | 2/2011 | Kariya et al. ................ 361/768 |

* cited by examiner

*Primary Examiner* — Boris L Chervinsky

(74) *Attorney, Agent, or Firm* — Schmeiser, Olsen & Watts LLP

(57) ABSTRACT

The present invention provides a circuit board having electronic components integrated therein, including a carrier board having an metallic oxide layer formed on each two surfaces of a metal layer, and having at least one through cavity; at least a semiconductor chip hold in the opening; at least a capacitor disposed on one surface of the carrier board, wherein the surface with the capacitor disposed thereon is at the same side with the active surface of the semiconductor chip. The capacitor is constituted of a first electrode plate disposed on partial surface of one side of the carrier board, a high dielectric material layer disposed on the surface of the first electrode plate, and a second electrode plate, paralleling and corresponding to the first electrode plate, disposed on the surface of the high dielectric material. The metal layer and the oxidation layer of the carrier board can enhance rigidity as well as tenacity and also integrate semiconductor chips and capacitors in the circuit board structure.

19 Claims, 10 Drawing Sheets

CIRCUIT BOARD STRUCTURE HAVING ELECTRONIC COMPONENTS INTEGRATED THEREIN

BACKGROUND OF THE INVENTION

1. Field of the Invention

The present invention relates to a circuit board having electronic components integrated therein, and more particularly to a circuit board having semiconductor chips and capacitors integrated therein.

2. Description of the Prior Art

A semiconductor package in which electronic components are embedded in the substrate is developed in the semiconductor industry along with the trend towards low-profile and light-weighted electronic devices. For examples, typically a circuit board structure with embedded electronic components are formed by embedding active components such as semiconductor chips, or inactive components such as resistors, capacitors, and inductors in the substrate followed by forming circuits on the substrate. On the other hand, ceramic materials are often chosen in the fabrication of the substrate due to its high Young's modulus therefore better rigidity.

Since the ceramic substrate has a better rigidity property and thus is capable of sustaining a certain degree of stress without deformation, thus is suitable to be used in a substrate that has unsymmetrical built-up structures on two sides of the core board panel, without having warpage problem. However since ceramic core board, panel is brittle in property, it may crack once the stress is larger than that the panel can sustain. In typical fabrication of the core board made of ceramic, as the ceramic panel has a poor flexibility when the sum of stress of the unsymmetrical built-up structures is larger than the limit the core board panel can sustain, the core board panel may crack, and unable to proceed to the following processes.

Thus, the conventional technology is still unsuitable to be used in the fabrication of large size thin-substrate panels.

Accordingly, there is an urgent need to develop a circuit board structure with integrated electronic components so that the prior art problem that the ceramic core board is unsuitable for large size thin-substrate due to its low flexibility of ceramic material when used in fabricating the carrier of the semiconductor chip can be solved, and capacitors can be directly formed in the circuit board.

SUMMARY OF THE INVENTION

In light of the foregoing drawbacks of the prior all, a primary objective of the present invention is to provide a circuit board having electronic components integrated therein for enhancing the structural rigidity of the circuit board, so as to prevent warpage due to unbalanced built-up structures, as well as tenacity to reduce the possibility of panel cracking, for large-sized thin substrate with embedded chips therein.

Another objective of the invention is to provide a circuit board having electronic components integrated therein for integrating active components mid passive components, to thereby simplify package structure.

In order to achieve the foregoing and other objectives, the circuit board having electronic components integrated therein comprises: a carrier board which is formed by respectively forming a first metallic oxide layer and a second metallic oxide layer on two sides of a metal layer, and has at least one through cavity penetrating the carrier board; at least one semiconductor chip bold in the through cavity and having an active surface with a plurality of electrode thereon and an inactive surface; at least one capacitor disposed on one surface of the carrier board, wherein the surface is at the same side with the active surface of the semiconductor chip, aid the capacitor is constituted of a first electrode plate disposed on a part of the surface of the carrier board, a high dielectric material layer disposed on the surface of the first electrode plate, and a second electrode plate, paralleling and corresponding to the first electrode plate, disposed on the surface of the high dielectric material layer.

The foregoing structure further comprises an adhesive material filling the gap between the through cavity of the carrier board and the semiconductor chip, so as to fix the semiconductor chip in the through cavity. Further, a built-up structure is disposed on the side of the carrier board having the capacitors. The built-up structure comprises at least one dielectric layer, at least one circuit layer together with a plurality of conductive vias. The conductive vias comprises a first, second, and third conductive via, each of which is electrically connected to the first electrode plate of the capacitor, second electrode plate, and electrode plates of the semiconductor chip respectively. Moreover, a plurality of conductive pads are disposed on the outer surface of the built-up structure.

In the foregoing structure, the dielectric layer of the built-up structure can replace the adhesive material to fill the gap between the through cavity of the carrier board and the semiconductor chip, so as to fix the semiconductor chip in the through cavity.

The foregoing structure further comprises another built-up structure disposed on the side of the carrier board free of the capacitors. The built-up structure comprises at least one dielectric layer, at least one circuit layer together with a plurality of conductive vias. A plurality of conductive pads are disposed on the outer surface of the built-up structures. The carrier board has at least one conductive through hole for electrically connecting the built-up structures on two sides of the carrier board.

The foregoing structure further comprises another capacitor disposed between the other built-up structure and the carrier board and electrically connected by parts of the conductive vias in the built-up structure.

The foregoing structure further comprises a dielectric layer disposed between the other capacitor and the carrier board for providing better bonding between the capacitor and the carrier board and relieving the limitation of accommodating capacitors at the corresponding semiconductor chip area.

The major difference between the other embodiment of the invention and the foregoing embodiment is that the other embodiment further comprises a dielectric layer disposed between the active surface of the semiconductor chip (together with the surface of the carrier board at the same side with the active surface) and the capacitor for providing a better bonding between the capacitor and the carrier board. The dielectric layer can, replace the adhesive material to fill in the gap between the through cavity of the carrier board and the semiconductor chip, so as to fix the semiconductor chip in the through cavity. Other main components can be referred in the foregoing embodiment, therefore are not given herein.

The metal layer in the foregoing carrier board is made of aluminum and the two metallic oxide layers are made of oxidized aluminum.

The present invention also provides another circuit board structure having electronic components integrated therein, comprising: a carrier board which is formed by respectively forming a first metallic oxide layer and a second metallic oxide layer on two sides of a metal layer, and has at least one through cavity penetrating the carrier board; at least one semiconductor chip hold in the through cavity and having an active surface with a plurality of electrode thereon and an inactive surface; and at least one capacitor disposed one surface of the carrier board, wherein the surface is at the same side with the inactive surface of the semiconductor chip, and the capacitor is constituted of a first electrode plate disposed on a partial surface of one side of the first metallic oxide layer, a light dielectric material layer material layer disposed on the surface of the first electrode plate, and a second electrode plate, paralleling and corresponding to the first electrode plate, disposed on the surface of the high dielectric material layer.

The foregoing structure further comprises an adhesive material filling the gap between the through cavity of the carrier board and the semiconductor chip, to thereby fix the semiconductor chip in the through cavity. Further, a built-up structure is disposed on the side of the carrier board free of the capacitors. The built-up structure comprises at least one dielectric layer, at least one circuit layer together with a plurality of conductive vias. Parts of the conductive vias electrically connect to the electrode pads of the semiconductor chip. Moreover, a plurality of conductive pads are disposed on the outer surface of the built-up structure.

In the foregoing structure, the dielectric layer of the built-up structure can replace the adhesive material to fill the gap between the through cavity of the carrier board and the semiconductor chip, so as to fix the semiconductor chip in the through cavity.

The foregoing structure further comprises another built-up structure disposed on the side of the carrier board having the capacitors. The built-up structure comprises at least one dielectric layer, at least one circuit layer together with a plurality of conductive vias. The conductive vias comprise a first conductive via and a second conductive via, electrically connecting to the first electrode plate and the second electrode plate of the capacitor respectively. A plurality of conductive pads are disposed on the outer surface of the built-up structure. The carrier board has at least one conductive through hole for electrically connecting the built-up structures on two sides of the carrier board.

The difference between the other embodiment and the foregoing embodiments is that it further comprises a dielectric layer disposed between tie capacitor and the carrier board for providing a better bonding between the capacitor and the carrier board and relieving the limitation of accommodating capacitors at the corresponding semiconductor chip area. The other main components can be referred in the foregoing embodiments, therefore are not given herein.

The circuit board having electronic components integrated therein in die present invention utilizes the compound structure of a carrier board made of a metal layer, wherein the two surfaces thereof are oxidized to form metallic oxide layers, so as to enhance the rigidity of the carrier board. The rigidity of the metallic oxide layer can sustain the uneven stress generated due to unbalanced built-up structures, and thus can prevent warpage. Moreover the tenacity of the metal layer also can absorb some of the uneven stress, therefore reduce the possibility of panel cracking.

Moreover, in the circuit board structure of the invention, at least one capacitor is disposed on at least one metallic oxide layer, so as to integrate the semiconductor chip and capacitors in the circuit board.

BRIEF DESCRIPTION OF THE DRAWINGS

The present invention can be more fully understood by reading the following detailed description of the preferred embodiment, with reference made to the accompanying drawings, wherein.

DETAILED DESCRIPTION OF THE PREFERRED EMBODIMENTS

The present invention is described in the following with specific embodiments, so that one skilled in the pertinent art can easily understand other advantages and effects of the present invention from the disclosure of the present invention.

First Embodiment

Referring to FIGS. 1A-1D, cross-sectional schematic views of a circuit board having electronic components integrated therein of the present invention are shown.

Figure 1A:
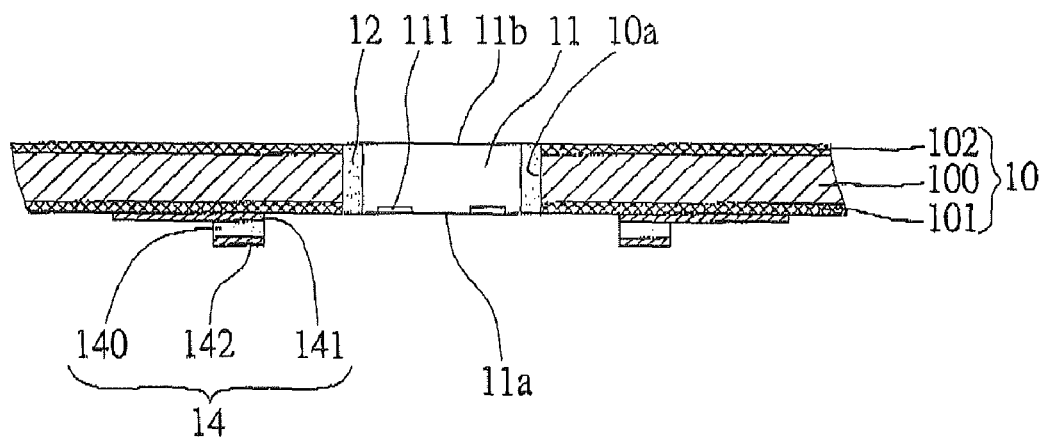
FIGS. 1A-1D and FIGS. 2A-2D are cross-sectional schematic views of a circuit board having electronic components integrated therein of a first preferred embodiment of the invention.

As shown in FIG. 1A, the circuit board having electronic components integrated therein comprises: a carrier board 10, at least one semiconductor chip 11 and a capacitor 14. The carrier board 10 is formed by respectively forming a first metallic oxide layer 101 and a second metallic oxide layer 102 on two sides of a metal layer 102. The metal layer 100 is made of aluminum which is oxidized to form the first metallic oxide layer 101 and second metallic oxide layer 102 on each side respectively for enhancing the rigidity of the carrier board 10. Moreover, the carrier board 10 has at least one through cavity 10a penetrating the carrier board 10. The semiconductor chip 11 is hold in the through cavity 10a of the carrier board 10. The semiconductor chip 11 has an active surface 11a with a plurality of electrode pads 111 thereon and an opposing inactive surface. The active surface 11a of the semiconductor chip 11 is at the same side with the first metallic oxide layer 101. An adhesive material 12 fills the gap between the through cavity 10a and the semiconductor clip 11 to fix the semiconductor chip 11 in the through cavity 10a. At least one capacitor 14 is disposed on the surface of the first metallic oxide layer 101 of the carrier board 10. The capacitor 14 is constituted of a first electrode plate 141 disposed on a partial surface of the first metallic oxide layer 101, a high dielectric material layer 140 disposed on the surface of the first electrode plate 141, and a second electrode plate 142, paralleling and corresponding to the first electrode plate 141) disposed on the surface of the high dielectric material layer 140.

Figure 1B:
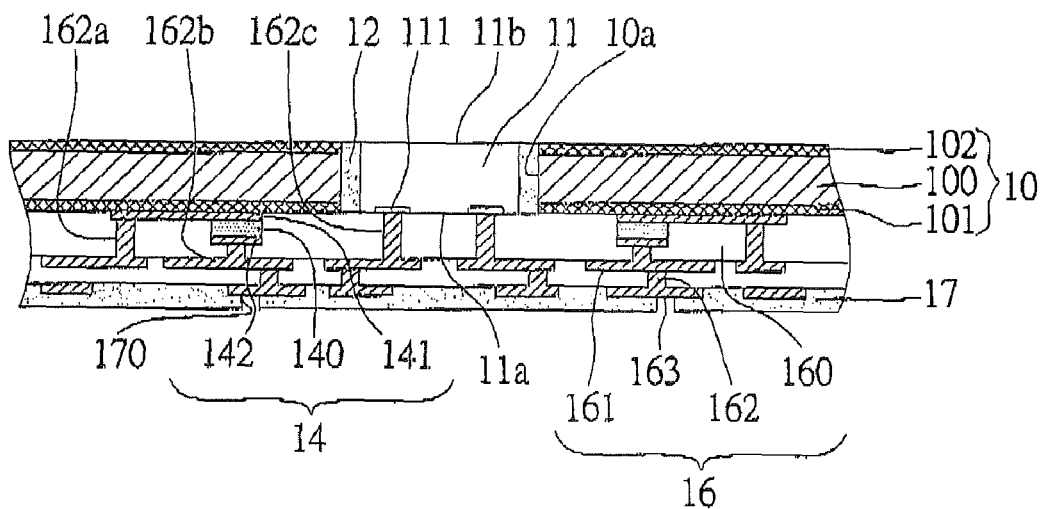

Next, as shown in FIG. 1B, a built-up structure 16 is disposed on one side of the carrier board 10 having capacitors 14. The built-up structure 16 is constituted of at least one dielectric layer 160, at least circuit layer 161 on the dielectric layer 160 together with a plurality of conductive vias 162 in the dielectric layer 160. These conductive vias 162 comprise a first, second, and third conductive vias 162a, 162b, 162c, electrically connecting to the first electrode plate 141, second electrode plate 142, and electrode pad 111 of the semiconductor chip 11, respectively. Moreover, a solder masker layer 17 is disposed on the outer surface of the built-up structure 16.

The solder mask layer 17 has a plurality of openings 170 for exposing the conductive pads 163.

Figure 1C:
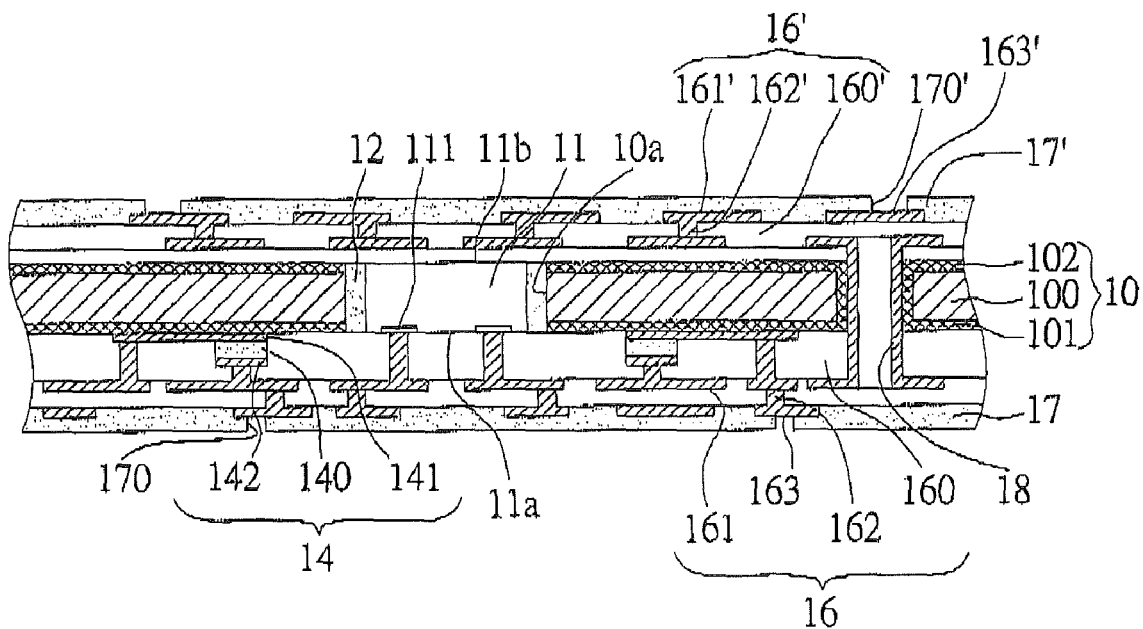

As shown in FIG. 1C, the foregoing structure further comprises another built-up structure 16' disposed on one side of the carrier board 10 free of capacitors. The built-up structure 16' comprises at least one dielectric layer 160', at least one circuit layer 161' together with a plurality of conductive vias 162'. A plurality of conductive pads 163' are disposed on the outer surface of the built-up structure 16'. Moreover, at least one conductive through hole 18 is disposed in the carrier board 10 for electrically connecting the built-up structures 16 and 16' on two sides of the carrier board 10. A solder mask layer 17' is disposed on the outer surface of the built-up structure 16' with a plurality of openings 170' for exposing the conductive pads 163'.

Figure 1D:
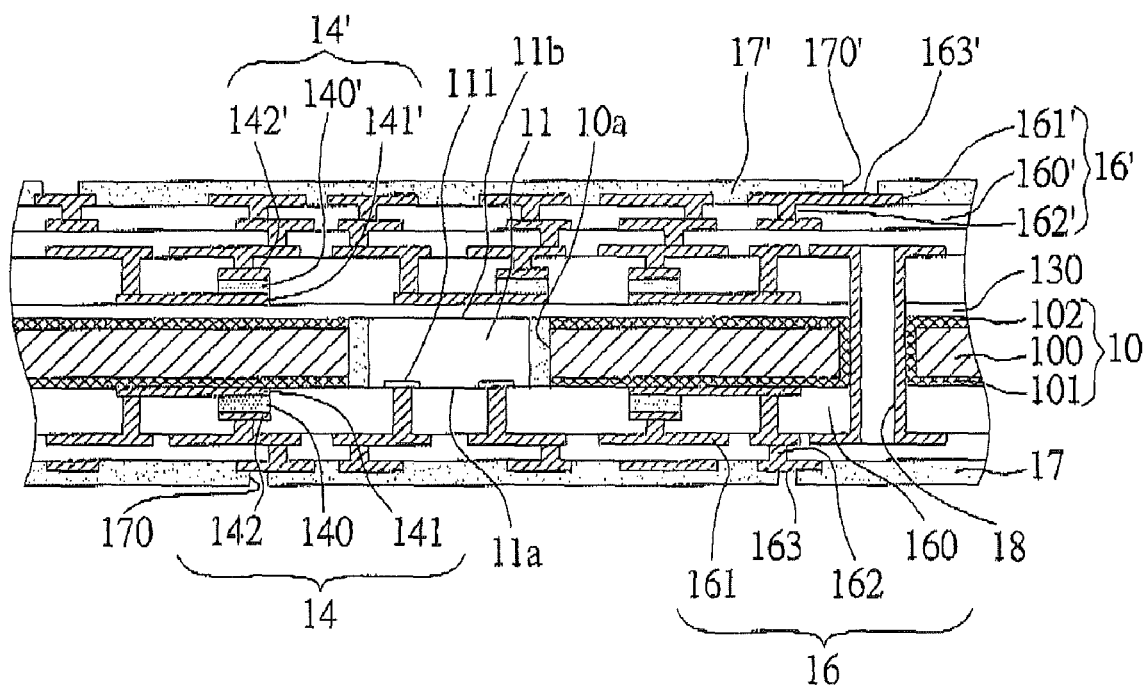
Figure 2A:
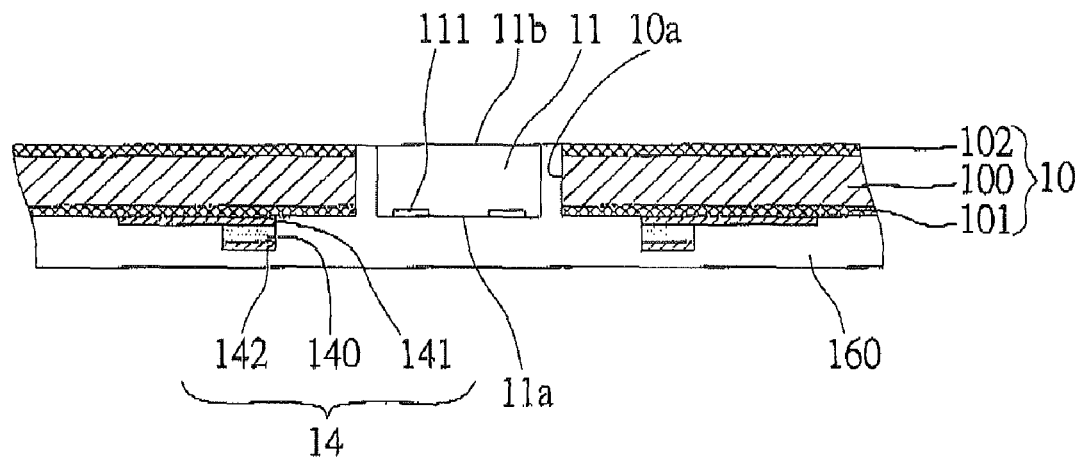
Figure 2B:
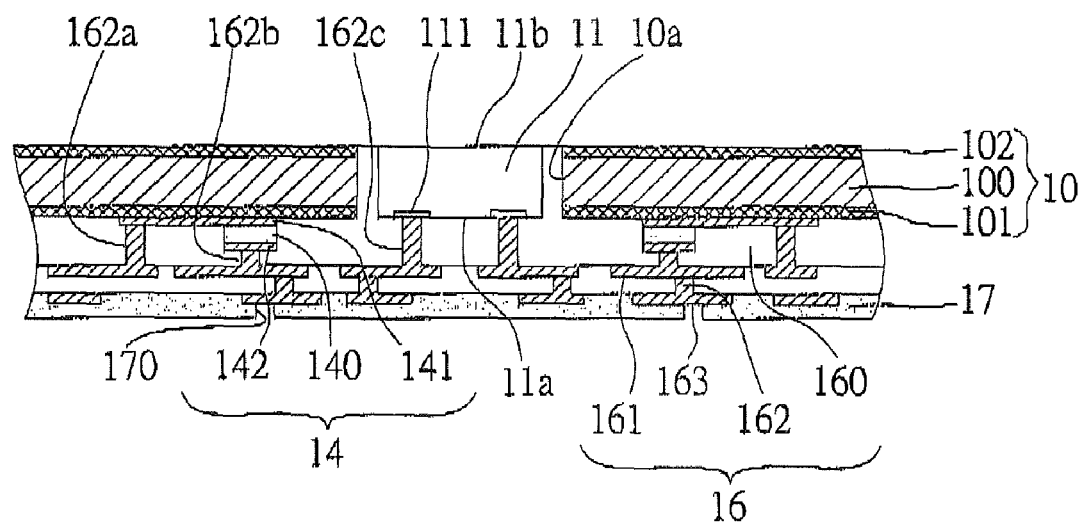
Figure 2C:
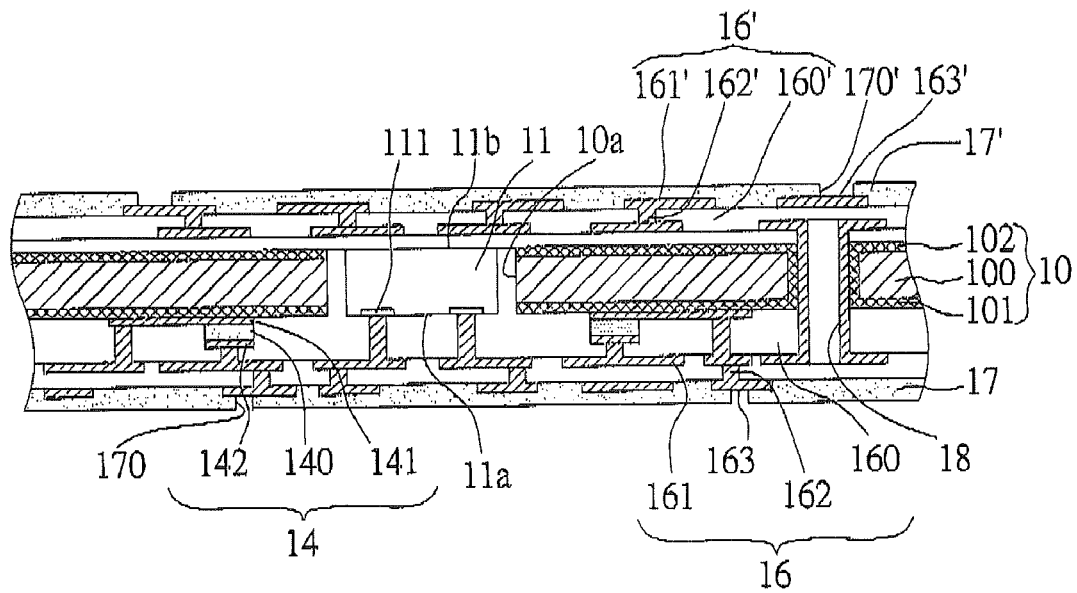
Figure 2D:
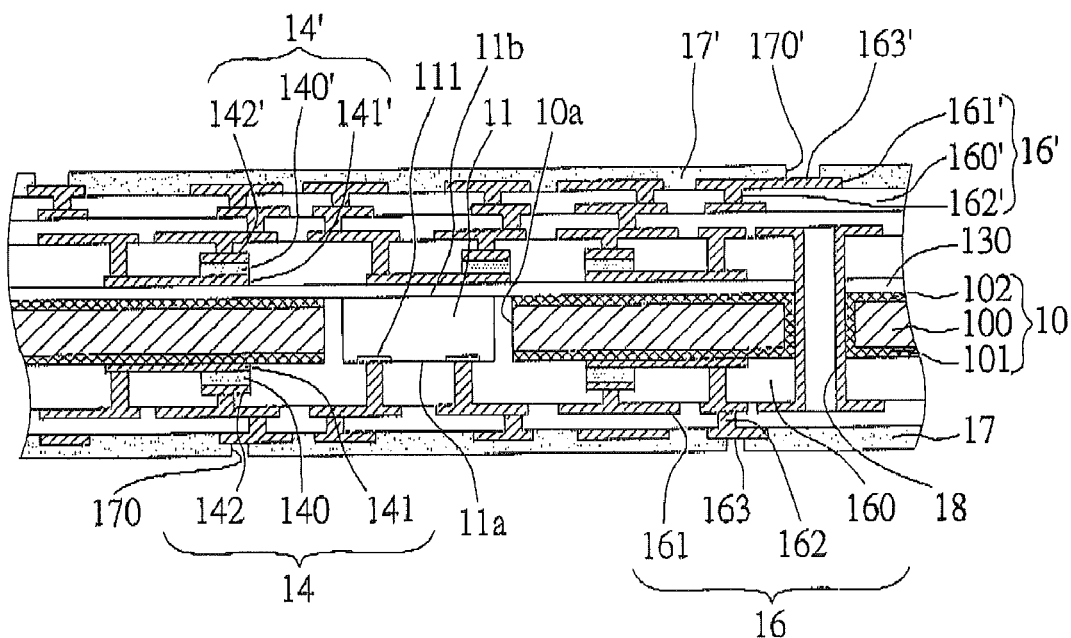
Figure 3A:
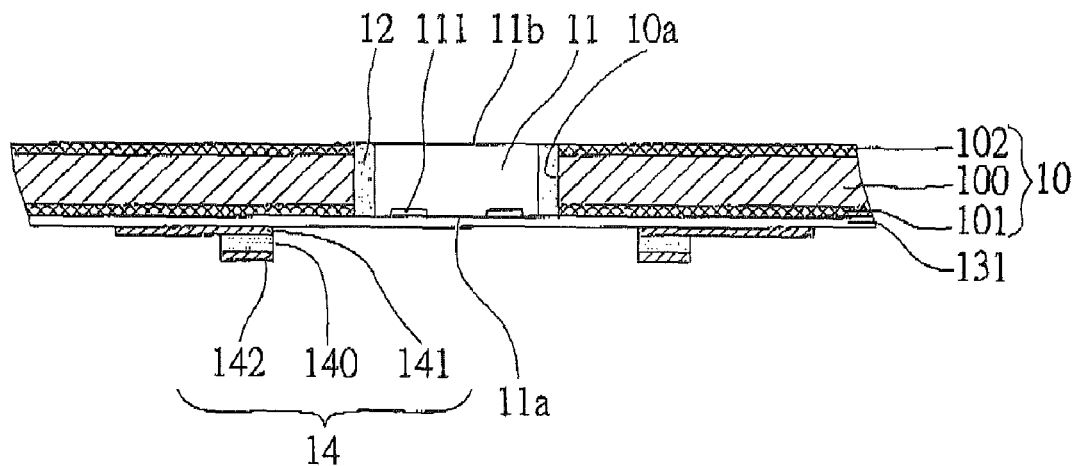
FIGS. 3A-3D and FIGS. 4A-4D are cross-sectional schematic views of a circuit board having electronic components integrated therein of a second preferred embodiment of the invention.
Figure 3B:
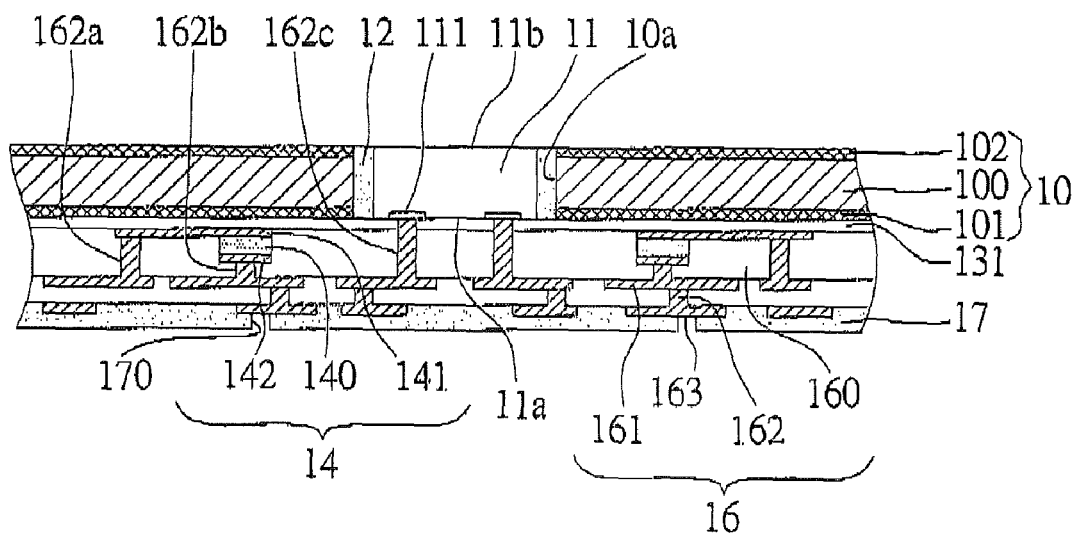
Figure 3C:
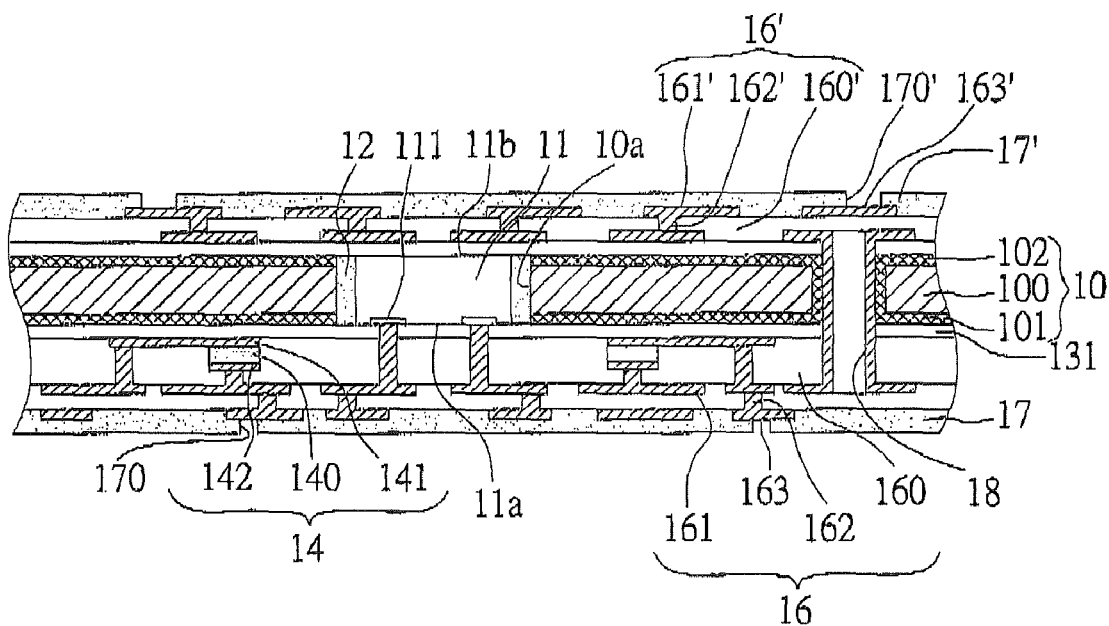
Figure 3D:
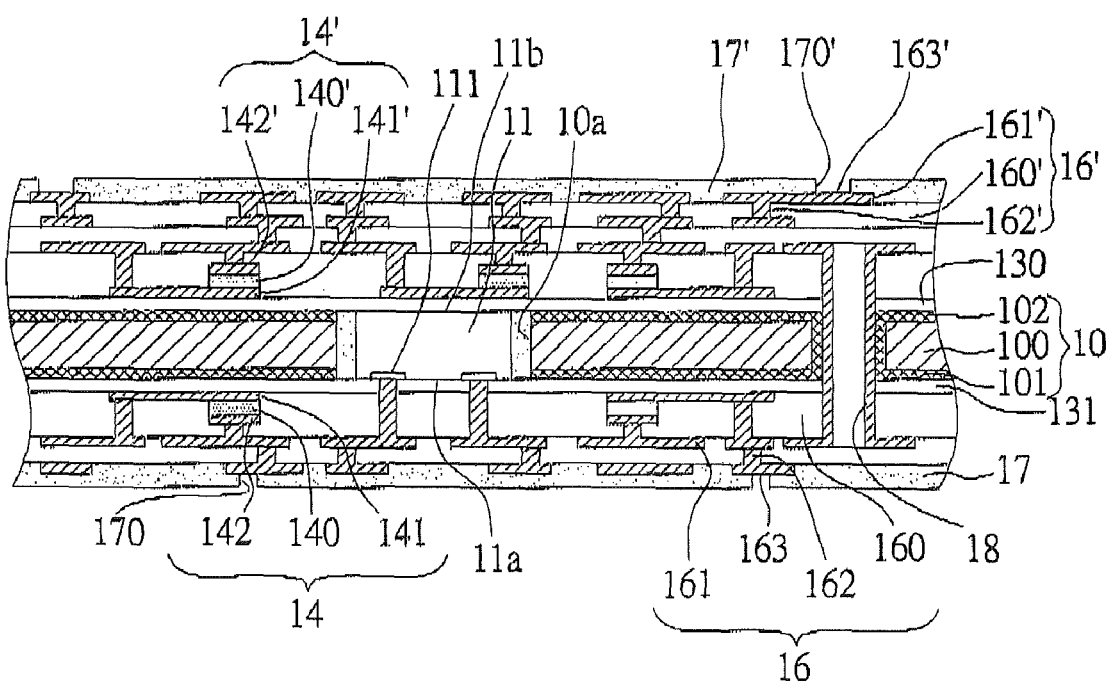
Figure 4A:
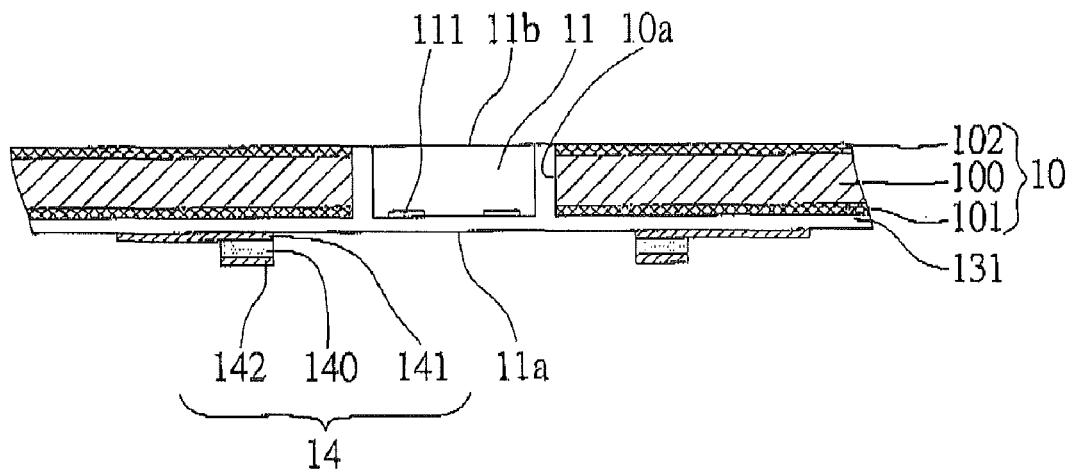
Figure 4B:
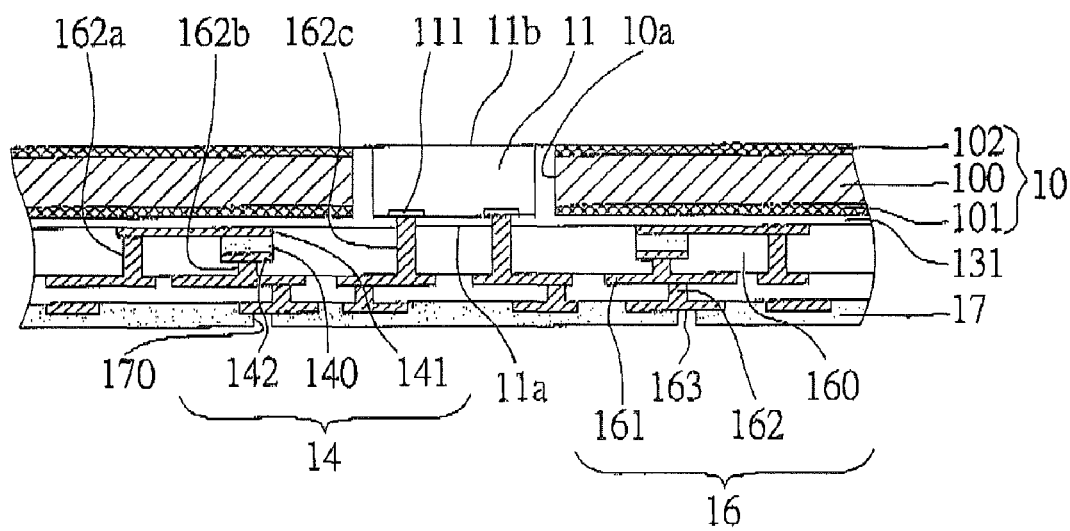
Figure 4C:
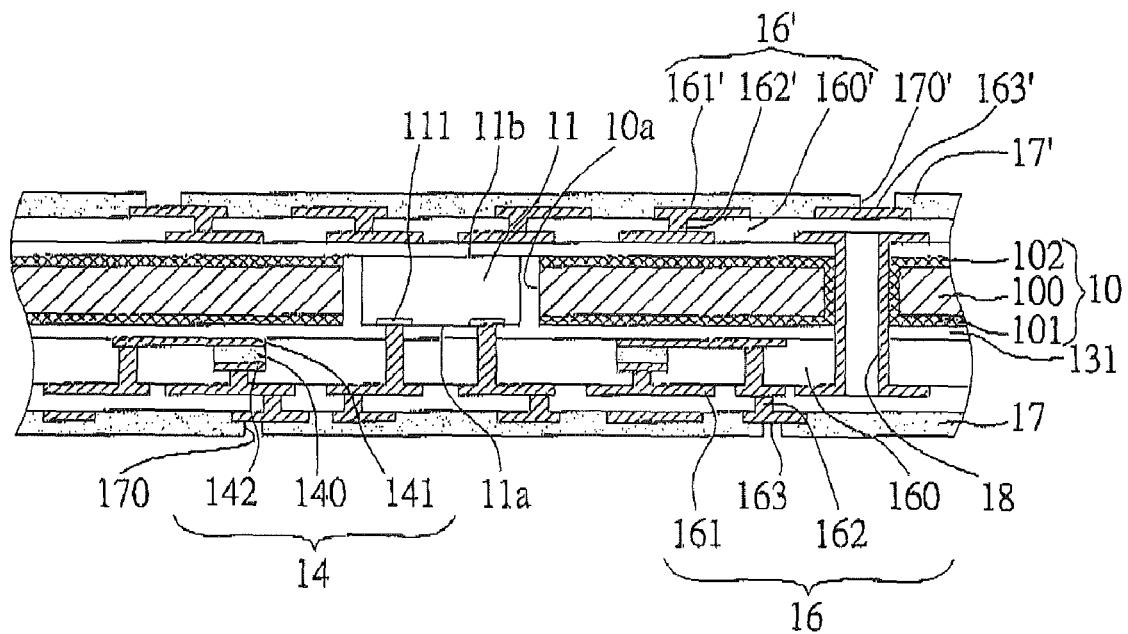
Figure 4D:
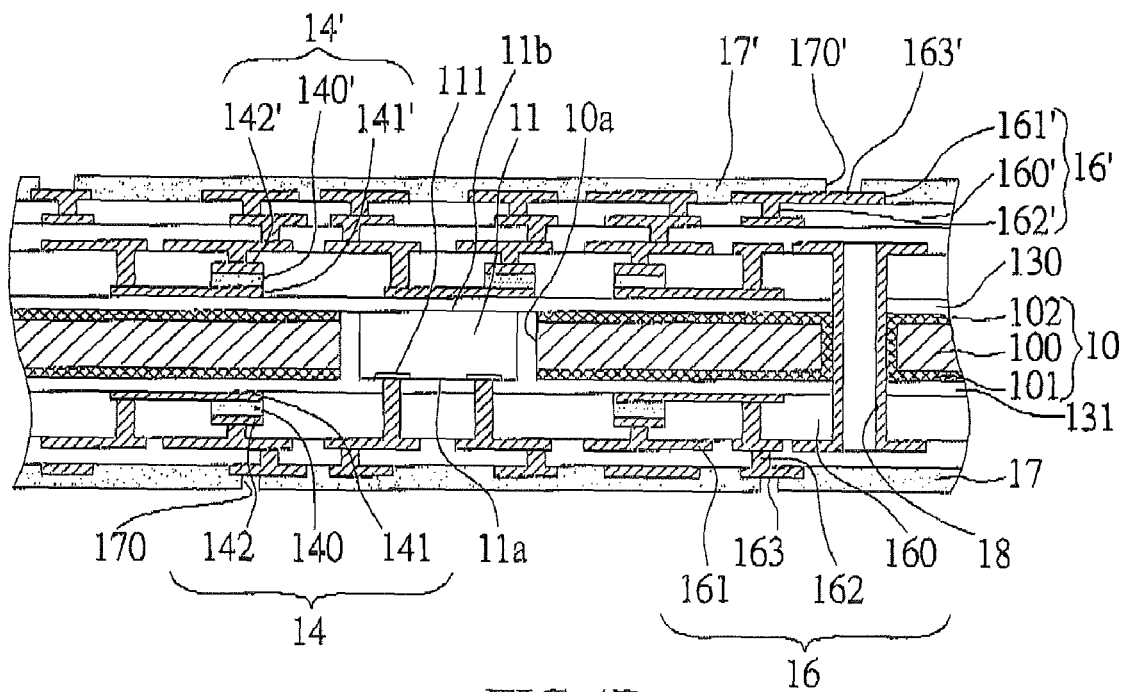

As shown in FIG. 1D, alternatively, a multilayer circuit board structure having capacitors 14 and 14' and built-up structure 16, 16' can be disclosed by disposing another capacitor 14' on the second metallic oxide layer 102 in advance, followed by dispose another built-up structure 16' on the side of the carrier board 10 having the capacitor 14', wherein parts of the conductive vias 162' in the built-up structure 16' electrically connect to the first electrode plate 141' in the capacitor 14' and the second electrode plate 142'.

The foregoing structure further comprises a dielectric layer 130 disposed between the capacitor 14' and the carrier board 10 for providing better bonding between the capacitor 14' and the carrier board 10, and relieving the limitation of accommodating capacitors at the corresponding semiconductor chip 11 area.

Referring FIGS. 2A-2D, in this embodiment the dielectric layer 160 of the built-up structure 16 also can replace the adhesive material or filling the gap between the through cavity 10a of the carrier board 10 and the semiconductor chip 11, so as to fix the semiconductor chip 11 in the through cavity 10a.

Second Embodiment

Referring to FIGS. 3A-3D, the difference between the second embodiment and the first embodiment is that the second embodiment further comprises a dielectric layer 131 disposed between the active surface 11a of the semiconductor chip 11 (together with the surface of the carrier board 10 at the same side) and the capacitors 14 for providing a better bonding between the capacitor 14 and the carrier board 10. Further referring to FIG. 4A-4D, in this embodiment, the dielectric layer 131 can replace the adhesive material to fill the gap between the through cavity 10a of the carrier board 10 and the semiconductor chip 11, so as to fix the semiconductor chip 11 in the through cavity 10a. Other main components in this embodiment can be referred to that of the first embodiment, therefore not given herein.

Third Embodiment

Figure 5:
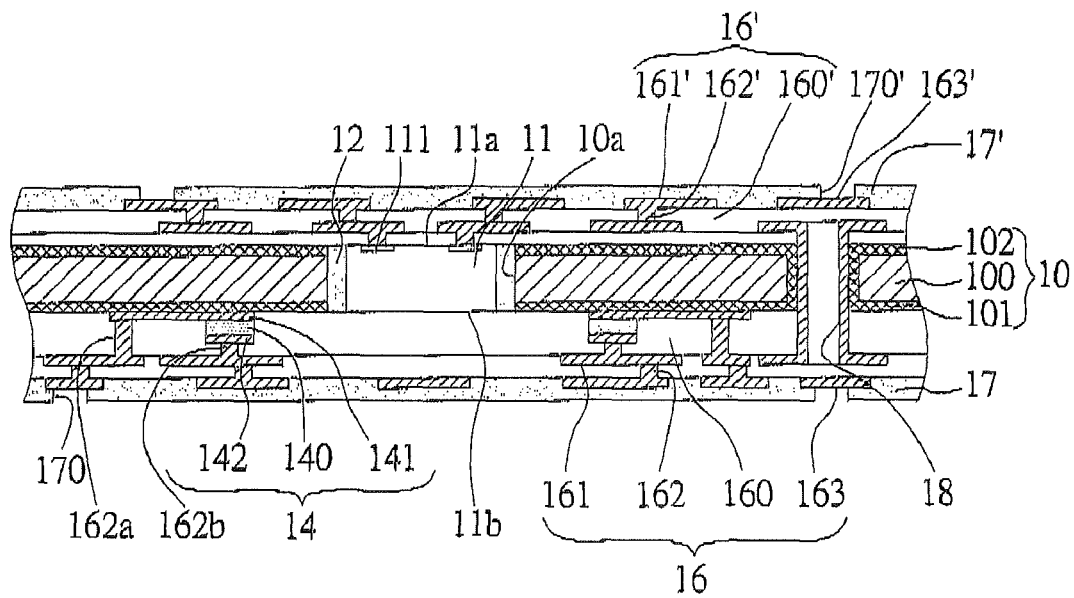
FIGS. 5 and 6 are cross-sectional schematic views of a circuit board having electronic components integrated therein of a third preferred embodiment of the invention.

FIG. 5 shows a cross-sectional view of the circuit board having electronic components integrated therein of the third embodiment of the invention. The difference of this embodiment from the other embodiments is that in this embodiment the active surface 11a of the semiconductor chip 11 is at the same side with the second metallic oxide layer 102 of the carrier board. 10 which is formed by respectively forming a first metallic oxide layer 101 and a second metallic oxide layer 102 on two sides of a metal layer 100, and, a through cavity 10a penetrating the carrier board; at least one semiconductor chip 11 having an active surface 11a with a plurality of electrode pads 111 thereon and an inactive surface 11b, hold in the through cavity 10a, wherein the active surface 11a of the semiconductor chip 11 is at the same side with the second metallic oxide layer 102; an adhesive material 12 filling the gap between the through cavity 10a and the semiconductor chip 11 for fixing the semiconductor chip 11 in the through cavity 10a; and at least one capacitor 14 disposed on the first metallic oxide layer 101 of the carrier board 10 and the inactive surface 11b of the semiconductor chip 11. The capacitor 14 is constituted of a first electrode plate 141 disposed on a partial surface of one side of the first metallic oxide layer 101, a high dielectric material layer 140 disposed on the surface of the first electrode plate 141 and a second electrode plate 142, paralleling and corresponding to the first electrode plate 141, disposed on the surface of the high dielectric material layer 140.

Next, a built-up structure 16' is disposed on one side of the carrier board 10 free of capacitors 14. The built-up structure 16' is constituted of at least one dielectric layer 160', at least one circuit layer 161' together with a plurality of conductive vias 162', and parts of the conductive vias 162' are electrically connected to the electrode pads 111 of the semiconductor chip 11. Moreover, a solder masker layer 17' is disposed on the outer surface of the built-tip structure 16'. The solder mask layer 17' has a plurality of openings 170' for exposing the conductive pads 163'.

The foregoing structure further comprises another built-up structure 16 disposed on one side of the carrier board 10 having the capacitors 14. The built-up structure 16 comprises at least one dielectric layer 160, at least one circuit layer 161 together with a plurality of conductive vias 162. These conductive vias 162 comprise a first, and second conductive vias 162a, 162b, electrically connecting to the first electrode plate 141, and the second electrode plate 142 respectively. A plurality of conductive pads 163 are disposed on the outer surface of the built-up structure 16. Moreover, at least one conductive through hole 18 is disposed in the carrier board 10 for electrically connecting the built-up structures 16 and 16' on two sides of the carrier board 10. A solder mask layer 17 is disposed on the outer surface of the built-up structure 16 with a plurality of openings 170 for exposing die conductive pads 163.

Figure 6:
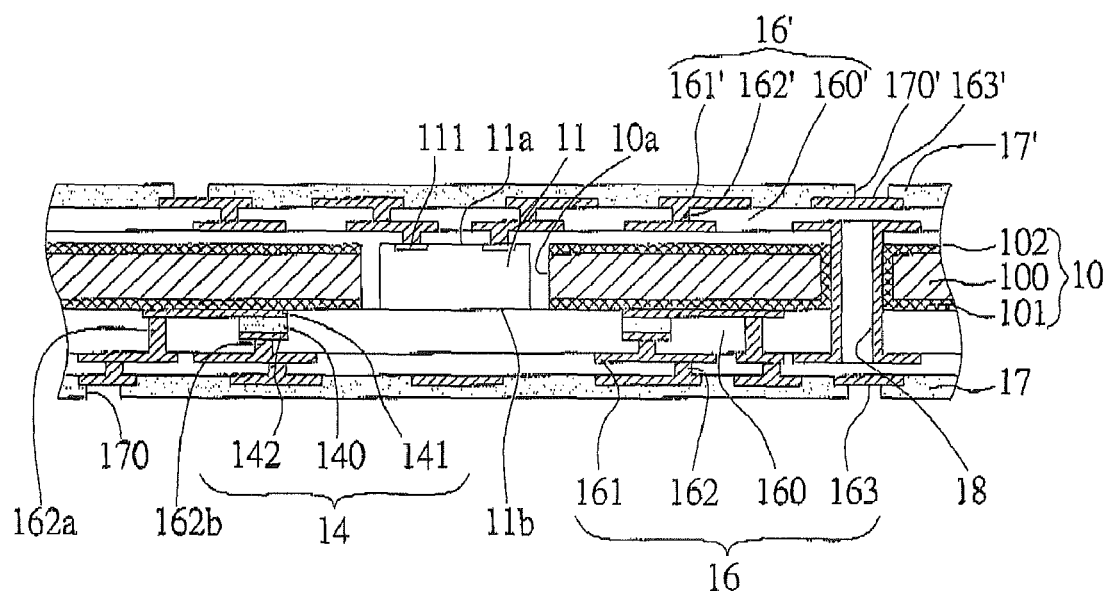

As shown in FIG. 6, in this embodiment, the dielectric layer 160' of the built-up structure 16' also can replace the adhesive material for filling the gap between the through cavity 10a of the carrier board 10 and the semiconductor chip 11, so as to fix the semiconductor chip 11 in the through cavity 10a.

Fourth Embodiment

Figure 7:
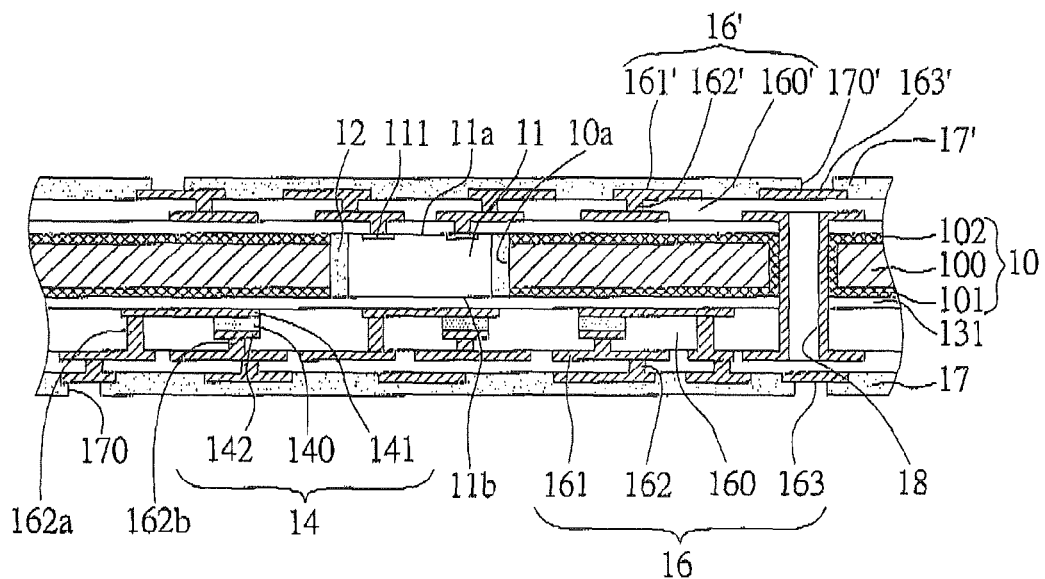
FIGS. 7 and 8 are cross-sectional schematic views of a circuit board having electronic components integrated therein of a forth preferred embodiment of the invention.
Figure 8:
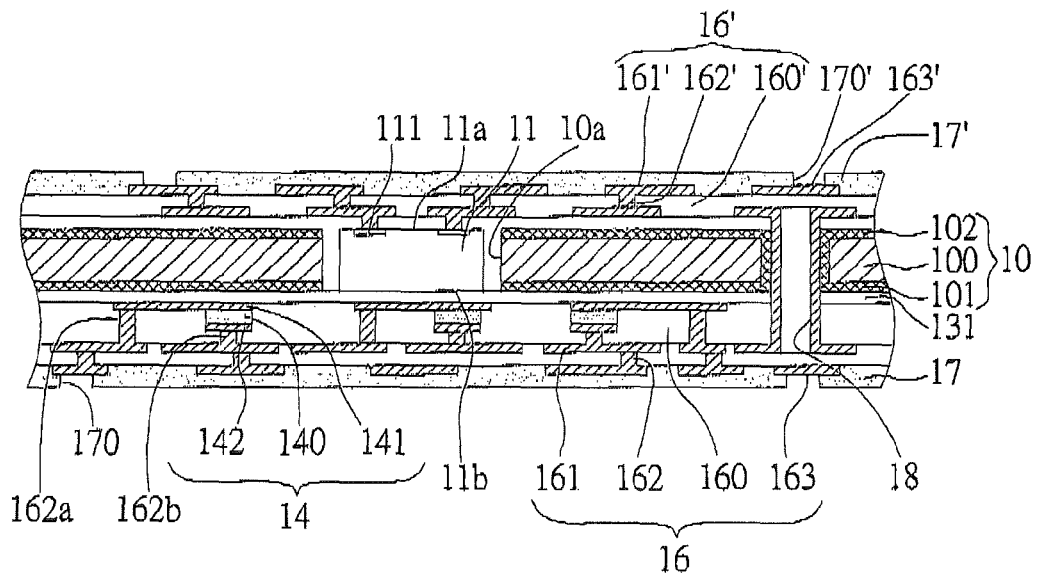

Referring to FIG. 7, the difference between the forth embodiment and the third embodiment is that the forth embodiment further comprises a dielectric layer 131 disposed between the inactive surface 11b of the semiconductor chip 11 (together with the surface of the carrier board 10 at the same side) and the capacitor 14 for providing a better bonding between the capacitor 14 and the carrier board 10 and relieving the limitation of accommodating capacitors at the corresponding semiconductor chip 11 area. Further referring to FIG. 8, in this embodiment, the dielectric layer 160' can replace the adhesive material to fill the gap between the through cavity 10a of the carrier board 10 and the semiconductor chip 11 so as to fix the semiconductor chip 11 in the through cavity 10a. Other main components in this embodiment can be referred to that of the third embodiment, therefore not given herein.

In comparison with the conventional technology, the circuit board having electronic components integrated therein is characterized by having a metal layer 100 with two surfaces oxidized to form a first, and second metallic oxide layer 101, 102 for enhancing the rigidity of the carrier board, such that the first, and second metallic oxide layer 101, 102 can sustain the unbalanced stress due to uneven built-up structures, so as to prevent warpage. The tenacity of the metal layer 100 can absorb part of the unbalanced stress, so as to reduce the possibility of panel cracking.

Furthermore in the circuit board structure, at least one capacitor 14,14' can be disposed on the first or second metallic oxide layer 101,102, so as to integrate the semiconductor chip and capacitors in the circuit board.

The present invention has been described using exemplary preferred embodiments. However, it is to be understood that the scope of the present invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A circuit board having electronic components integrated therein, comprising:
    a carrier board which is formed by respectively forming a first metallic oxide layer and a second metallic oxide layer on two sides of a metal layer, and has at least one through cavity penetrating the carrier board;
    at least one semiconductor chip hold in the through cavity and having an active surface with a plurality of electrode thereon and an inactive surface; and
    at least one capacitor, disposed on one surface of the carrier board, wherein the surface is at the same side with the active surface of the semiconductor chip, and the capacitor is constituted of a first electrode plate disposed on a part of the surface of the carrier board, a high dielectric material layer disposed on the surface of the first electrode plate, and a second electrode plate, paralleling and corresponding to the first electrode plate, disposed on the surface of the high dielectric material layer.

2. The circuit board of claim 1, further comprises an adhesive material filling the gap between the through cavity of the carrier board and the semiconductor chip, so as to fix the semiconductor chip in the through cavity.

3. The circuit board of claim 1, further comprises a dielectric layer, disposed between the capacitor and the carrier board, and on the active surface of the semiconductor chip for providing a better bonding between the capacitor and the carrier board.

4. The circuit board of claim 3, wherein the dielectric layer fills the gap between the through cavity of the carrier board and the semiconductor chip, so as to fix the semiconductor chip in the through cavity.

5. The circuit board of claim 1, further comprises a built-up structure disposed on the side of the carrier board having the capacitors, wherein the built-up structure is constituted of at least one dielectric layer, at least one circuit layer together with a plurality of conductive vias, and a plurality of conductive pads are disposed on the outer surface of the built-tip structure.

6. The circuit board of claim 5, wherein the conductive vias comprise first, second, and third conductive vias, electrically connecting to the first electrode plate of the capacitor, the second electrode plate, and the electrode pads of the semiconductor chip, respectively.

7. The circuit board of claim 5, wherein the dielectric layer fills the gap between the through cavity of the carrier board and the semiconductor chip, so as to fix the semiconductor chip in the through cavity.

8. The circuit board of claim 5, further comprises another built-up structure disposed on the side of tie carrier board free of capacitors, wherein the built-up stricture is constituted of at least one dielectric layer, at least one circuit layer together with a plurality of conductive vias, and a plurality of conductive pads are disposed on the outer surface of the built-up structure, further the carrier board has a conductive through hole for electrically connecting the built-up structures on two sides of the carrier board.

9. The circuit board of claim 8, further comprises another capacitor disposed between the built-up structure and the carrier board and electrically connected by parts of the conductive vias of the built-up structure.

10. The circuit board of claim 9, further comprises a dielectric layer disposed between the capacitor and carrier board for providing a better bonding between the capacitor and the carrier board, and relieving the limitation of accommodating capacitors at the corresponding semiconductor chip area.

11. The circuit board of claim 1, wherein the metal layer is aluminum and the two metallic oxide layers are oxidized aluminum.

12. A circuit board having electronic components integrated therein, comprising:
    a carrier board which is formed by respectively forming a first metallic oxide layer and a second metallic oxide layer on two sides of a metal layer, and has at least one through cavity penetrating the carrier board;
    at least one semiconductor chip, hold in the through cavity and having an active surface with a plurality of electrode thereon and an inactive surface; and
    at least one capacitor, disposed on one side of the carrier board, wherein the surface is at the same side with the inactive surface of the semiconductor chip, and the capacitor is constituted of a first electrode plate disposed on a part of the surface of the carrier board, a high dielectric material layer disposed on the surface of the first electrode plate, and a second electrode plate, paralleling and corresponding to the first electrode plate, disposed on the surface of the high dielectric material layer.

13. The circuit board of claim 12, further comprises an adhesive material filling the gap between the through cavity of the carrier board and the semiconductor chip, so as to fix the semiconductor chip in the through cavity.

14. The circuit board of claim 12, further comprises a built-up structure disposed on the side of the carrier board free of capacitors, wherein the built-up structure is constituted of at least one dielectric layer, at least one circuit layer together with a plurality of conductive vias, and a plurality of conductive pads are disposed on the outer surface of the built-up structure.

15. The circuit board of claim 14, wherein the dielectric layer fills the gap between the through cavity of the carrier board and the semiconductor chip, so as to fix the semiconductor chip in the through cavity.

16. The circuit board of claim 12, further comprises a dielectric layer disposed between the capacitor and the carrier board for providing a better bonding between the capacitor and the carrier board, and relieving the limitation of accommodating capacitors at the corresponding semiconductor chip area.

17. The circuit board of claim 12, further comprises another built-up structure disposed on the side of the carrier board having the capacitors, wherein the built-up structure is constituted of at least one dielectric layer, at least one circuit layer together with a plurality of conductive vias, and a plurality of conductive pads are disposed on the outer surface of the built-up structure, further the carrier board has a conductive through hole for electrically connecting the built-up structures on two sides of the carrier board.

18. The circuit board of claim 17, wherein the conductive vias comprise first, and second conductive vias, electrically connecting to the first electrode plate and the second electrode plate respectively.

19. The circuit board of claim 12, wherein the metal layer is aluminum and the two metallic oxide layers are oxidized aluminum.

* * * * *